United States Patent [19]

Chave

[11] Patent Number: 5,057,970
[45] Date of Patent: Oct. 15, 1991

[54] ELECTRONIC POWER COMPONENT CIRCUIT

[75] Inventor: Jacques Chave, Lyons, France
[73] Assignee: GEC Alsthom SA, Paris, France
[21] Appl. No.: 596,126
[22] Filed: Oct. 11, 1990

[30] Foreign Application Priority Data

Oct. 11, 1989 [FR] France .................. 89 13278

[51] Int. Cl.⁵ .............................. H05K 7/20
[52] U.S. Cl. ...................... 361/386; 361/388; 363/141
[58] Field of Search ............... 174/16.3; 361/386, 388, 361/389, 400; 363/141

[56] References Cited

U.S. PATENT DOCUMENTS

| | | | |
|---|---|---|---|
| 3,710,193 | 1/1973 | Greenberg et al. ............... | 361/386 |
| 4,670,833 | 6/1987 | Sachs .................................. | 361/386 |
| 4,901,203 | 2/1990 | Kobayashi et al. ................ | 361/386 |

FOREIGN PATENT DOCUMENTS

| | | |
|---|---|---|
| 3630830 | 3/1988 | Fed. Rep. of Germany . |
| 8811949 | 1/1989 | Fed. Rep. of Germany . |
| 2128620 | 10/1972 | France . |

Primary Examiner—Gregory D. Thompson
Attorney, Agent, or Firm—Sughrue, Mion, Zinn, Macpeak & Seas

[57] ABSTRACT

An electronic power component circuit comprising low level electronic control circuits mounted on a platform over electronic power circuits constituted as a hybrid circuit, in which the low level electronic control circuits are also constituted as a hybrid circuit, being formed on a substrate of aluminum nitride.

3 Claims, 1 Drawing Sheet

ELECTRONIC POWER COMPONENT CIRCUIT

The present invention relates to hybrid power circuits, and more particularly to low level control of electronic power components constituting such circuits.

BACKGROUND OF THE INVENTION

In order to dissipate and evacuate the heat produced by a hybrid power circuit in operation, the circuit may be soldered on a heat-dissipating slab, generally made of copper and itself fixed to a radiator.

Since this problem of dissipating and evacuating heat is less critical for low level electronic control circuits, more compact assemblies may be obtained by disposing these control circuits on a platform overlying the hybrid power circuit, with the platform generally being constituted by a printed circuit which is electrically connected to the hybrid power circuit.

Nevertheless, the heat produced by the control circuits in operation is not negligible and proper operation of the assembly is therefore not guaranteed.

The object of the present invention is to enable the low level control portion of a hybrid power circuit to retain the platform emplacement while nevertheless ensuring effective cooling thereof while using a small amount of space, smaller than that required conventionally for cooling a hybrid circuit, as outlined above.

SUMMARY OF THE INVENTION

The present invention provides an electronic power component circuit comprising low level electronic control circuits mounted on a platform over electronic power circuits constituted as a hybrid circuit, in which the low level electronic control circuits are also constituted as a hybrid circuit, being formed on a substrate of aluminum nitride.

BRIEF DESCRIPTION OF THE DRAWING

Embodiments of the invention are described by way of example with reference to the accompanying drawing, in which.

DETAILED DESCRIPTION

Figure 1:
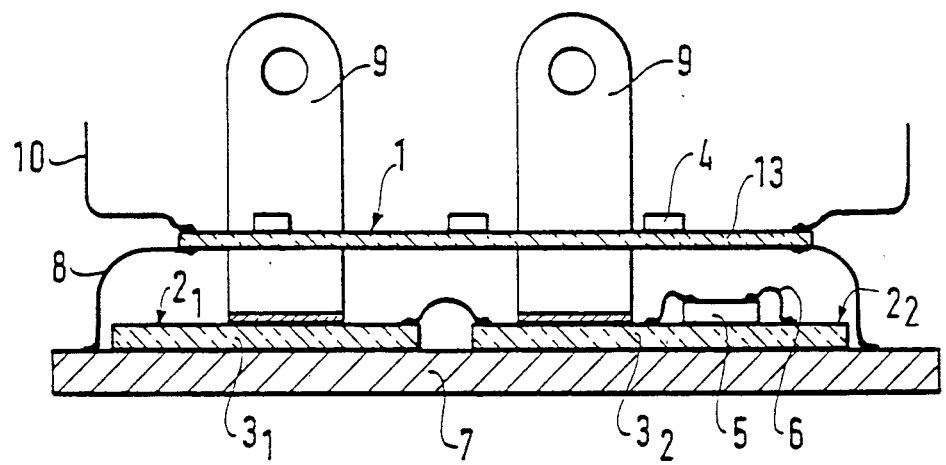
FIG. 1 is a view of a first embodiment of the invention.
Figure 2:
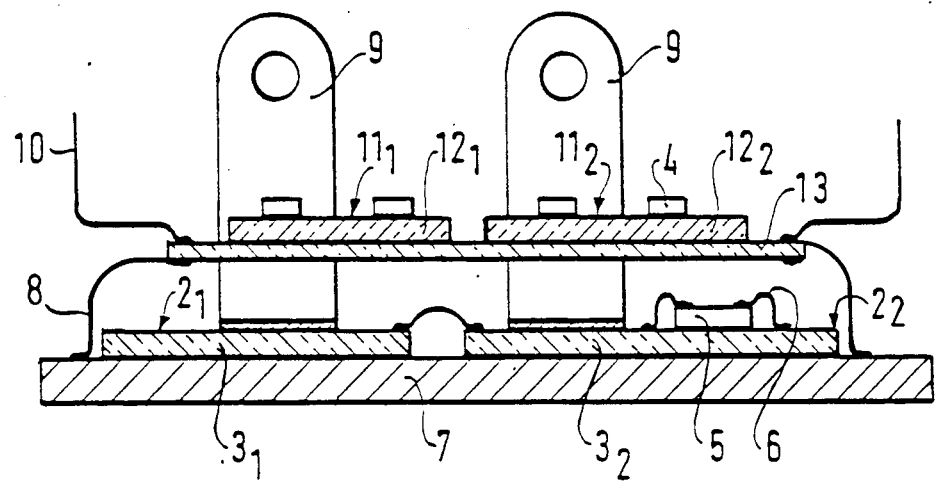
FIG. 2 is a view of a second embodiment of the invention.

FIGS. 1 and 2 are both cross-section views through component assemblies in accordance with the invention. In both figures, beneath a platform 1 carrying low level electronic control circuits, there can be seen a hybrid power circuit constituted by elementary hybrid circuits such as $2_1$ and $2_2$ carrying electronic power circuits printed on a substrate ($3_1$ and $3_2$, respectively). These section views only show electronic components such as 4 and 5 which respectively constitute the electronic control circuits and the electronic power circuits. There can also be seen bonding wires 6 interconnecting the connection tabs of the active components in the electronic power circuits to corresponding connection tabs on the substrates $3_1$ $3_2$. The substrates $3_1$, $3_2$ are conventionally made of a substance such as alumina and they are soldered on a heat-dissipating slab 7.

The control platform 1 is also constituted by a hybrid circuit but it cannot be fixed to the heat dissipating slab since that would occupy too much space. It is made on a substrate of aluminum nitride which has very good thermal conductivity.

Heat is evacuated therefrom by connecting the aluminum nitride substrate via heat drains such as 8 to the heat dissipating slab or else to brackets 9 for connecting the hybrid power circuit to components external thereto.

The connection brackets 9 and the heat drains 8 may also serve as supports for the control platform.

The hybrid control circuit is also provided with brackets such as 10 for connecting external components to said circuit.

In the embodiment shown in FIG. 1, the control circuits are printed entirely on the aluminum nitride substrate whereas in the embodiment shown in FIG. 2, the only tracks printed on the aluminum nitride substrate are for interconnecting elementary hybrid circuits such as $11_1$ and $11_2$ formed on respective alumina substrates $12_1$ and $12_2$ which are soldered to the aluminum nitride substrate 13 which has soldering areas provided thereon for this purpose.

I claim:

1. An electronic power component circuit comprising:
    at least one electronic power circuit, said at least one electronic power circuit constituting a hybrid power circuit;
    a platform including an aluminum nitride substrate;
    a heat dissipating slab;
    means fixedly mounting said platform in overlying position relative to said electronic power circuit, said hybrid power circuit being fixed directly to said heat dissipating slab, and said aluminum nitride substrate being connected to said heat dissipating slab via heat drains constituting said means fixedly mounting said platform in overlying position relative to said electronic power circuit; and
    low level electronic control circuits fixed to said substrate of aluminum nitride.

2. An electronic power component circuit comprising:
    at least one electronic power circuit, said at least one electronic power circuit constituting a hybrid power circuit;
    a platform;
    a heat dissipating slab;
    means fixedly mounting said platform to said heat dissipating slab in overlying position to said electronic power circuit, said platform comprising a substrate of aluminum nitride; and
    low level electronic control circuits fixed to said substrate of aluminum nitride, and wherein said means fixedly mounting said platform to said heat dissipating slab comprise brackets for connecting said hybrid power circuit to items external thereto, and wherein said brackets are thermally coupled to said heat dissipating slab for dissipating heat from said electronic control circuits through said heat dissipating slab.

3. An electronic power component circuit according to claim 1, wherein said electronic control circuits are soldered directly on said aluminum nitride substrate.

* * * * *